United States Patent [19]

Rapp

[11] 4,189,785
[45] Feb. 19, 1980

[54] COMPLEMENTARY MOS MEMORY ARRAY INCLUDING COMPLEMENTARY MOS MEMORY CELLS THEREFOR

[75] Inventor: Adolph K. Rapp, Santa Clara, Calif.

[73] Assignee: National Semiconductor Corporation, Santa Clara, Calif.

[21] Appl. No.: 900,410

[22] Filed: Apr. 26, 1978

[51] Int. Cl.² ............................................. G11C 11/40
[52] U.S. Cl. .................................. 365/156; 307/290; 365/154
[58] Field of Search ...................... 365/103, 154, 156; 307/238, 279, 290

[56] References Cited

U.S. PATENT DOCUMENTS

| 3,882,467 | 5/1975 | Pricer | 365/156 |
| 3,964,031 | 6/1976 | Eaton | 365/181 |
| 4,095,281 | 6/1978 | Denes | 365/156 |

Primary Examiner—Terrell W. Fears
Attorney, Agent, or Firm—Gail W. Woodward

[57] ABSTRACT

A memory array employs a plurality of four-transistor storage cells. Each storage cell includes first and second P channel MOSFETs and first and second N channel MOSFETs. The sources of the first and second P channel MOSFETs are connected to a supply conductor. The drain of the first P channel MOSFET is connected to the drain of the first N channel MOSFET. The drain of the second P channel MOSFET is similarly connected to the drain of the second N channel MOSFET. The gates of the first P channel and first N channel MOSFETs are connected together and to the connected drains of the second P channel and second N channel MOSFETs. The gates of the second P channel and second N channel MOSFETs are connected to the drains of the first P channel and first N channel MOSFETs. The source of the first N channel MOSFET is connected to a row line of the memory array and the source of the second N channel MOSFET is connected to a column line of the memory array. In the array, the memory cells in each row share a respective common first conductor, and all of the memory cells in each column share a common second conductor.

20 Claims, 3 Drawing Figures

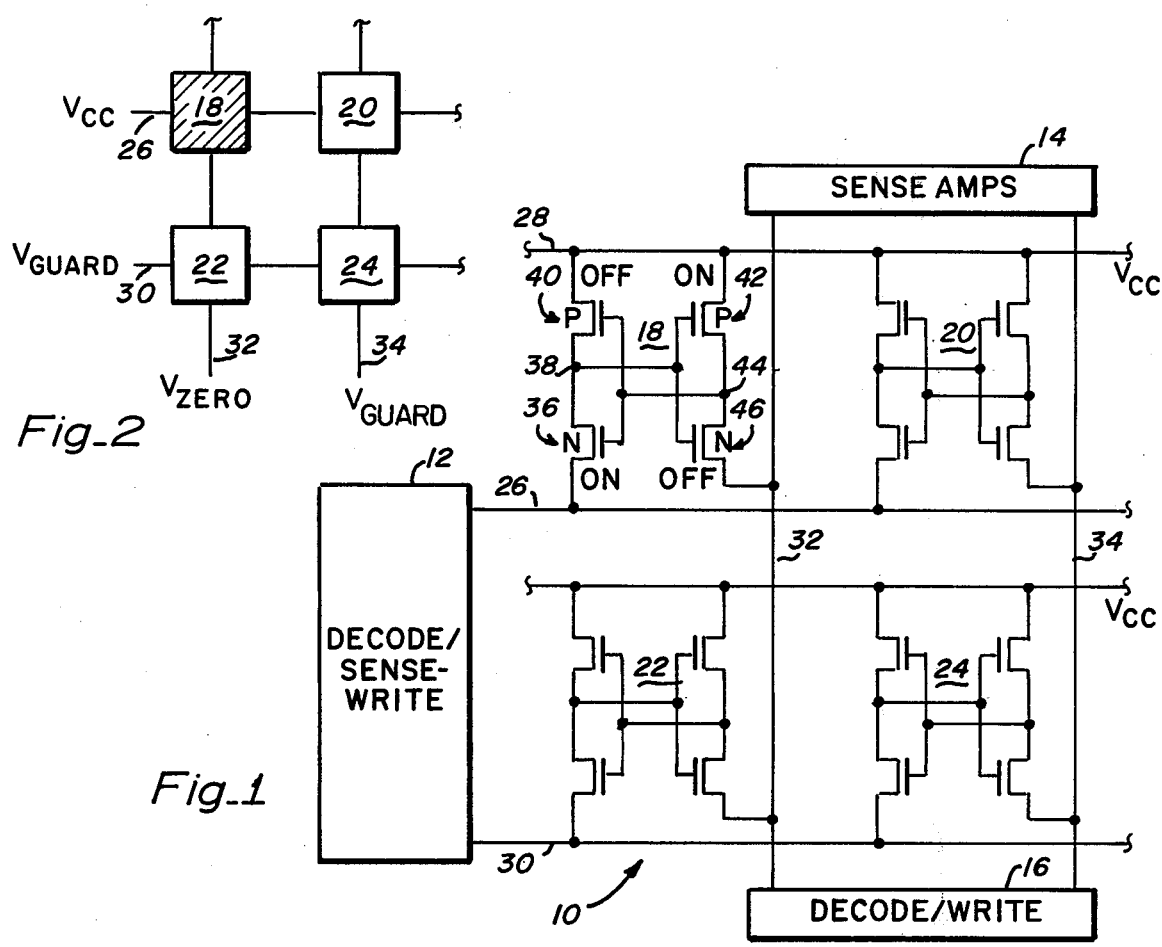
*Fig_2*
*Fig_1*
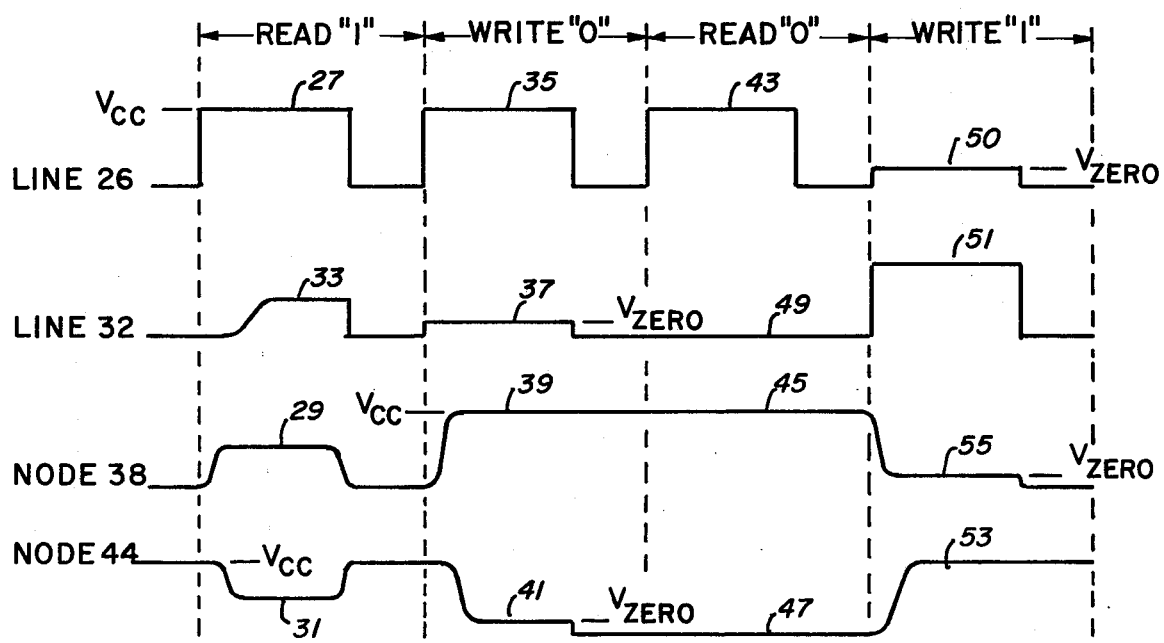
*Fig_3*

COMPLEMENTARY MOS MEMORY ARRAY INCLUDING COMPLEMENTARY MOS MEMORY CELLS THEREFOR

BACKGROUND OF THE INVENTION

1. Field of the Invention

This invention relates generally to semiconductor memory arrays and semiconductor storage elements and, more particularly, to memory arrays of complementary transistors and complementary transistor memory cells used therein. Most especially, the invention relates to CMOS memory arrays and the CMOS memory cells used in such arrays.

2. Brief Description of the Prior Art

CMOS (Complementary Metal Oxide Semiconductor) circuits have been widely utilized in applications where extremely low power dissipation is a necessity. Various digital logic circuits have been implemented using CMOS technology, including applications requiring random access memory storage cells. Known CMOS random access memory cells have ordinarily utilized at least five or six field effect transistors, forming two cross-coupled CMOS inverters each including a P channel MOSFET and an N channel MOSFET coupled in series and having their gate electrodes connected together. Information is stored in such a cross-coupled circuit as a "0" or a "1" depending on which inverter circuit is conducting and which is non-conducting. In order to obtain an unambiguous indication of the state of such a cross-coupled circuit, a pair of selection MOSFETs have also been required, one coupled to each one of two storage nodes defined by the cross-coupled inverters. Electrodes of the two selection MOSFETs are in turn coupled to decoding circuitry.

In the typical six-transistor cell $V_{DD}$ and $V_{SS}$ lines are supplied. However, since adjacent cells can share such power supply lines, each cell could be regarded as requiring a half line for each supply terminal. Each cell is supplied with two column lines and a row line thus causing the cell to employ a total of four lines. In the prior art five transistor cells one line is omitted to result in a three-line structure.

In addition to the line count, the prior art CMOS storage cells utilize a rather large amount of semiconductor chip area. Therefore the density of arrays of such cells has been undesirably low, and consequently the production cost per cell or bit has been rather high. There is a need for a higher density CMOS storage array and cell which requires fewer lines, less semiconductor chip area, and would be less expensive to produce.

It is possible to arrange CMOS cells in an array, each cell of which can be unambiguously sensed without providing extra transistors for this purposes in each cell and fewer lines are required.

SUMMARY OF THE INVENTION

It is an object of this invention to provide an improved, low cost complementary field effect transistor storage cell.

It is another object of the invention to provide an improved array of low cost, complementary field effect transistor storage cells.

It is still another object of the invention to provide a complementary field effect transistor storage cell which consists of only four field effect transistors and requires only two and one half lines.

It is yet another object of the invention to provide an array of four device complementary field effect transistor memory cells, each cell of which can have its storage state unambiguously sensed without providing extra transistors in each cell for this purpose and without providing an extra full or half line.

The attainment of the foregoing and related objects, along with the attendant advantages and features, may be achieved through use of the novel memory cell and memory array incorporating the memory cell disclosed herein. Applicant has discovered that a memory circuit consisting of first and second transistors cross-coupled between their gates and a current flow electrode of the other transistor and third and fourth gating transistors serially connected respectively to the first and second transistors may be operated without providing either additional gating transistors for each cell or more than one half supply line, one word line, and one bit line per cell. This is accomplished by reversing the pulses respectively applied to the word and bit lines of the cell for writing in a "1" or a "0" into the memory cell, and by coupling the current flow path formed by the first and third transistors to the bit line and the current flow path formed by the second and fourth transistors to the word line.

In accordance with one embodiment of this invention, a complementary MOS memory array is disclosed which comprises a plurality of complementary MOS memory cells. Each one of the plurality of complementary MOS memory cells comprises two cross-coupled complementary pairs of MOS devices capable of latching in either of two states. One source region of both of the two complementary pairs of MOS devices is connected to a shared common $V_{CC}$ line. The other source region of one of the two complementary pairs is connected to a row line and the other source region of the other of the two complementary pairs is connected to a column line. Writing means are connected to each one of the plurality of complementary MOS memory cells for selectively writing information into each one of the plurality of complementary MOS memory cells. Reading means are connected to each one of the plurality of complementary MOS memory cells for reading the information stored in each one of the plurality of complementary MOS memory cells.

In accordance with another aspect of this invention, a complementary MOS memory cell is disclosed which comprises a first pair of complementary MOS devices connected in series and a second pair of complementary MOS devices connected in series and to the first pair of complementary MOS devices. A voltage bias or $V_{CC}$ line is connected to one MOS device of the first pair of complementary MOS devices and to one MOS device of the second pair of complementary MOS devices. The one MOS device of both the first and second pairs of complementary MOS devices is selected as either a P channel or N channel device, but preferably as a P channel device. A row line and a column line (two separate conductors) are connected to the complementary MOS memory cell. The other MOS device of the first pair of complementary MOS devices is connected to the row line and the other MOS device of the second pair of complementary MOS devices is connected to the column line. A plurality of such four transistor memory cells are arranged and connected up with the row line and column line conductors to form a plurality of rows and a plurality of columns. Each of the memory cells forming a particular row is connected to a common row line. Similarly, each of the memory cells forming a given column is connected to a common line.

BRIEF DESCRIPTION OF THE DRAWING

FIG. 1 is a partial block diagram—schematic diagram showing the cell of the invention and its relationship to a memory system;

FIG. 2 is a block diagram of the circuit of FIG. 1 showing particular cell selection; and FIG. 3 is a waveform diagram showing the operation of a cell.

DESCRIPTION OF THE INVENTION

Referring to FIG. 1, memory array 10 includes, for example, four CMOS memory or storage cells 18, 20, 22, and 24. While four is the minimum number, the number of memory cells and the number of rows and columns of such CMOS memory cells can be expanded to any desired number. Each of the CMOS memory cells shown in the drawing includes two P channel MOSFETs (MOS Field Effect Transistors) and two N channel MOSFETs. For a complete discussion of the structure and operation of MOSFETs, see "Physics and Technology of Semiconductor Devices" by A. S. Grove, 1967, John Wiley & Sons.

For the purpose of explaining the operation of each memory cell of the array 10, CMOS memory cell 18 will be described in detail. The CMOS storage cell 18 includes P channel MOSFET 40 which has its source connected to $V_{CC}$ conductor 28 and its drain connected to node 38 and its gate connected to node 44. The CMOS storage cell 18 also includes P channel MOSFET 42 which has its source connected to $V_{CC}$ conductor 28, its gate connected to node 38, and its drain connected to node 44. The CMOS storage cell 18 further includes N channel MOSFET 36 which has its drain connected to node 38, its source connected to select-write conductor 26, and its gate connected to node 44. Finally, the CMOS storage cell 18 also includes N channel MOSFET 46 which has its drain connected to node 44, its gate connected to node 38, and its source connected to sense write conductor 32. The structure of the CMOS storage cells 20, 22, and 24 is entirely similar to the CMOS storage cell 18 and will not be repeated. However, it should be noted that the select-write conductor 26 is common to all CMOS storage cells in the same row as the CMOS storage cell 18. Similarly, all CMOS storage cells in the row including the CMOS storage cells 22 and 24 share another select-write conductor 30. All of the storage cells in the column including CMOS storage cells 18 and 22 share the sense-write conductor 32; and, similarly, all CMOS storage cells in the column including the CMOS storage cells 20 and 24 share the common sense-write conductor 34. The sense-write conductors 32 and 34, which are bit lines, are coupled to circuitry shown schematically as block 14, which includes a plurality of sense amplifiers coupled, respectively, to a plurality of conductors including conductors 32 and 34. Decode/write circuitry shown schematically as block 16 is also connected to conductors 32 and 34. Decode/sense-write circuitry shown as block 12 is connected to the select-write conductors 26 and 30 which are word lines.

It should be noted that no additional selection MOSFETs are utilized in or for the CMOS storage cells shown in the drawing and each cell requires only two and one half lines.

FIG. 2 is a block diagram of array 10 of FIG. 1 showing how a particular cell is selected. While not shown, $V_{CC}$ is applied in common to all cells and is typically above 5 volts. In order to reliably select, for example, cell 18, line 26 is raised to $V_{CC}$. At the same time line 30 is held at a level $V_{guard}$. Line 32 is lowered to a level referred to as $V_{zero}$ and line 34 is held at $V_{guard}$. Cells 20, 22, and 24 are all held at $V_{guard}$ on one or the other lines, while cell 18 is operated at $V_{CC}$ and $V_{zero}$. For a particular level of $V_{CC}$, $V_{zero}$ and $V_{guard}$ are selected to have levels that will reliably act to switch or not switch the individual cells. That is, any cell supplied with $V_{guard}$ will not switch and any cell supplied with $V_{CC}$ and $V_{zero}$ will assume a state determined by the relative voltage levels of the row and column lines. Thus, in FIG. 2, only cell 18 will be switchable. It will assume the state dictated by the potentials on lines 26 and 32. If line 32 is at $V_{CC}$ and line 26 at $V_{zero}$, cell 18 will latch into a logic "1" state. If line 32 is at $V_{zero}$ potential and line 26 at $V_{CC}$, cell 18 will latch into a logic "0" state.

For an operating $V_{CC}$ of 5 volts, it has been found that a $V_{guard}$ level of 2 volts and a $V_{zero}$ level of 1 volts, will reliably establish cell latching for a wide variation in MOSFET characteristics resulting from manufacturing tolerances.

STANDBY MODE OF OPERATION

In the standby mode of operation, lines 26 and 30 are at ground or zero volts. Also lines 32 and 34 are grounded. In this condition, each of the CMOS storage cells will latch and maintain a particular logic state "1" or "0" with essentially microwatt or nanowatt power dissipation.

Assume, for the following discussion, that a logical "1" is to be defined in the CMOS storage cell 18 as meaning that the P channel MOSFET 42 and the N channel MOSFET 36 are on as shown. Node 44 is at 5 volts because the P channel MOSFET 42 connected to the 5 volt $V_{CC}$ line 28 is on. The N channel MOSFET 46 and the P channel MOSFET 40 will be off as shown. Node 38 is at 0 volts because the N channel MOSFET 36 connected to grounded line 26 is on. Since MOSFETs 40 and 46 are off, neither side of the cell draws an appreciable current and no appreciable power is consumed.

READ OPERATION

The detailed operation of a memory cell and array as shown in FIG. 1 may be understood by referring to the pulse program shown in FIG. 3. FIG. 3 depicts pulses applied to and sensed on the bit and word lines 26 and 32, as well as the voltages at nodes 38 and 44, during the sequence READ "1," WRITE "0," READ "0," and WRITE "1." Since only a selected cell is being considered, the voltage levels will be $V_{CC}$, ground, and $V_{zero}$.

The operation is as follows if it is desired to read the logical "1" assumed to be stored in the CMOS memory cell 18. First, line 32 is allowed to float, i.e., it is isolated from circuitry which would constrain it to a particular voltage level. By use of a low impedance connection, line 26 is raised in voltage to supply level $V_{CC}$, represented by pulse 27, from circuits 12. N channel FET 36 being on will drive node 38 to $V_{CC}$ less the threshold voltage of FET 36, as indicated by pulse 29 in FIG. 3. If $V_{CC}$ is 5 volts, pulse 29 will typically be about 2.5 volts. The presence of pulse 29 on node 38 decreases conduction of P channel FET 42 and turns on N channel FET 46, thus connecting node 44 to column line 32. The $V_{CC}$ potential at node 44, less the threshold voltage of FET 46 is then supplied to column line 32, as shown by negative excursion 31 on node 44. The result is pulse 33 on column line 32. Pulse 33 is sensed by sense amplifier circuitry 14 as the "1" state of circuit 18. The read "1" cycle is terminated by the end of pulse 27, which returns node 38 to 0 volts, thus returning FETs 42 and 46 to their original on and off states, respectively. This allows node 44 to return to its original $V_{CC}$ level, shown by termination of negative excursion 31. Pulse 33 on column line 32 thus terminates, line 32 is held at ground potential by decode/write circuitry 16, and the memory cell 18 is ready for another cycle.

The next cycle shown in FIG. 3 writes a "0" into memory cell 18. This is accomplished by the combination of a $V_{CC}$ pulse 35 on line 26 and an intermediate level pulse 37 indicated as $V_{zero}$ on line 32. Due to $V_{CC}$ on line 26, node 38 will be raised toward $V_{CC}$, as shown at 39, and node 44 is pulled all the way down to $V_{zero}$, as shown at 41. The result is to set cell 18 with P channel FET 40 and N channel FET 46 in their "ON" states, and P channel FET 42 and N channel FET 36 is their "OFF" states. At the conclusion of pulses 35 and 37, cell 18 has been set in the "0" state, and the cell is ready for another cycle.

The next cycle shown in FIG. 3 is reading a "0" state in memory cell 18. This reading operation is carried out as in the case of the read "1" cycle by providing a $V_{CC}$ pulse 43 on line 26 and allowing line 32 to float. Since N channel FET 36 is biased "OFF" when the cell 18 is the "0" state, read pulse 43 provides no effect at either node 38 or 44, as indicated at 45 and 47. Thus, no signal is produced on line 32, as indicated at 49. The absence of a signal on column line 32 during the read "0" cycle is interpreted by sense amplifier circuitry 14 as indicating a "0" state for memory cell 18. At the conclusion of read pulse 43, memory cell 18 is ready for the next cycle.

The final cycle shown in FIG. 3 is a write "1" cycle for memory cell 18. A $V_{zero}$ pulse 50 is applied on line 26 coincident with a $V_{CC}$ pulse 51 on line 32. N channel FET 46 will drive node 44 toward the 5 volt $V_{CC}$ level, as shown at 53. Raising node 44 turns off P channel FET 40, thus isolating node 38 from $V_{CC}$ line 28, allowing it to drop to $V_{zero}$, as shown at 55. This allows P channel FET 42 to turn on, thus connecting node 44 to $V_{CC}$ line 28 to maintain node 44 at the $V_{CC}$ potential during pulse 49. The cell 18 is now set in the "1" state.

It can now be seen how the reversal of the roles of line 26 and column line 32 in the write "0" operation and the write "1" operation eliminates the need for additional gating transistors in the memory cell beyond the two cross-coupled pairs of complementary transistors as shown. Prior cross-coupled four-transistor memory cells have required at least an extra line per cell for operation. Elimination of the "outboard" transistors in a cross-coupled memory design produces a very compact memory cell in integrated circuit form.

It should now be apparent that a memory cell and array capable of achieving the stated object of the invention has been described. A substantial reduction in cell size is achieved by eliminating two transistors from conventional cross-coupled complementary transistor memory cell designs. This result flows from being able to reverse the relationship between the signals on the row and column lines, depending on whether a "1" or a "1" is being written into the cell.

While the invention has been particularly shown and described with reference to a preferred embodiment thereof, it will be understood by those skilled in the art that other changes in form and detail and omissions may be made therein without departing from the spirit and scope of the invention. For example, while CMOS is the preferred device form, equivalent device structures could be used. Therefore, it is intended that the scope of the invention be limited only by the claims that follow.

What is claimed is:

1. A memory cell comprising, in combination, two cross-coupled pairs of MOS devices, each MOS device having two current flow electrodes and a current control gate, each of said pairs including MOS devices with series connected current flow electrodes, one current flow electrode of both of said two pairs being connected to a common bias potential line, the other current flow electrode of one of said two pairs being connected to a single row line, and the other current flow electrode of the other of said two pairs being connected to a single column line.

2. The memory cell of claim 1 wherein each of said pairs includes complementary MOS devices, each having source, drain, and gate electrodes.

3. A complementary MOS memory cell in accordance with claim 2 wherein each one of said two cross-coupled complementary pairs of MOS devices comprises a P channel MOS device connected in series to an N channel MOS device.

4. A complementary MOS memory cell in accordance with claim 3 wherein each one of said two cross-coupled complementary pairs of MOS devices has its drain regions electrically connected together.

5. A complementary MOS memory cell in accordance with claim 4 wherein each one of said two cross-coupled complementary pairs of MOS devices has its gate electrodes electrically connected together.

6. A complementary MOS memory cell in accordance with claim 5 wherein each one of said two cross-coupled complementary pairs of MOS devices has its gate electrodes electrically connected to the drain regions of the other one of said two cross-coupled complementary pairs of MOS devices.

7. A complementary MOS memory cell in accordance with claim 6 wherein said one source region of each of said two complementary pairs is an N type region, and said other source region of each of said two complementary pairs is a P type region.

8. A memory array comprising;
(a) a plurality of memory cells in accordance with claim 1, arranged in a two-dimensional array forming columns and rows, a single column line being provided for each column, and a single row line being provided for each row;
(b) means connected to each row and column line for providing signals selectively on each row and column line for writing information into said memory elements; and
(c) control means connected to said signal providing means for causing said signal providing means to present a first signal level on a selected one of said rows having a given relationship with respect to a second signal level presented on one of said column lines connected to one of said memory cells in the selected one of said rows to write a binary "ZERO" into said one of said memory cells, and to present said first signal level on the selected one of said columns and said second signal level on the selected one of said rows to write a binary "ONE" into said one of said memory cells.

9. A complementary MOS memory cell comprising, in combination, a first pair of complementary MOS devices connected in series, a second pair of complementary MOS devices connected in series and to said first pair of complementary MOS devices, a bias potential line connected to one MOS device of said first pair of complementary MOS devices and to one MOS device of said second pair of complementary MOS devices, said one MOS device of both said first and second pairs of complementary MOS devices being selected from the same one of a P channel and an N channel type MOS device, a single row line connected to the complementary MOS memory cell, the other MOS device of said first pair of complementary MOS devices being connected to said row line, a single column line connected to the MOS memory cell, the other MOS device of said second pair of complementary MOS devices being connected to said column line.

10. A complementary MOS memory cell in accordance with claim 9 wherein said one MOS device of both said first and second pairs of complementary devices is a P channel MOS device, and the other MOS device of both said first and second pairs of complementary devices is an N channel MOS device.

11. A complementary MOS memory cell in accordance with claim 10 wherein the source region of each said P channel MOS device of said first and second pairs of complementary MOS devices is connected to said bias potential line, the drain region of said P channel MOS device of said first pair of complementary MOS devices is connected to the drain region of said N channel device of said first pair of complementary MOS devices, and the drain region of said P channel MOS device of said second pair of complementary MOS devices is connected to the drain region of said N channel device of said second pair of complementary MOS devices.

12. A complementary MOS memory cell in accordance with claim 11 wherein the source region of said N channel device of said first pair of complementary MOS device is connected to said row line, and the source region of said N channel device of said second pair of complementary MOS device is connected to said column line.

13. A complementary MOS memory cell in accordance with claim 12 wherein the gate of said P channel device of said first pair of complementary MOS devices is connected to both the gate of said N channel device of said first pair of complementary MOS devices and to both drain regions of said second pair of complementary MOS devices, the gate of said P channel device of said second pair of complementary MOS devices is connected to both the gate of said N channel device of said second pair of complementary MOS devices and to both drain regions of said first pair of complementary MOS devices.

14. A complementary MOS memory array comprising, in combination, a plurality of complementary MOS memory cells, each one of said plurality of complementary MOS memory cells comprising two cross-coupled complementary pairs of series connected MOS devices, one source region of both of said two complementary pairs being connected to a common bias potential line, the other source region of one of said two complementary pairs being connected to a single row line, and the other source region of the other of said two complementary pairs being connected to a single column line, writing means connected to each one of said plurality of complementary MOS memory cells for selectively writing information into each one of said plurality of complementary MOS memory cells, and reading means connected to each one of said plurality of complementary MOS memory cells for reading the information stored in each one of said plurality of complementary MOS memory cells.

15. A memory array comprising;
(a) a plurality of memory cells in accordance with claim 9, arranged in a two-dimensional array forming columns and rows, a column line being provided for each column and a row line for each row;
(b) means connected to each row and column line for providing signals selectively on each row and column line for writing information into said memory elements; and
(c) control means connected to said signal providing means for causing said signal providing means to present a first signal level on a selected one of said rows having a given relationship with respect to a second signal level presented on one of said column lines connected to one of said memory cells in the selected one of said rows to write a binary "ZERO" into said one of said memory cells, and to present said first signal level on the selected one of said columns and said second signal level on the selected one of said rows to write a binary "ONE" into said one of said memory cells.

16. A complementary MOS memory array in accordance with claim 15 wherein said one source region of both of said two complementary pairs is an N type region, and said other source region of both of said two complementary pairs is a P type region.

17. A complementary MOS memory array in accordance with claim 15 wherein each one of said two cross-coupled complementary pairs of MOS devices comprises a P channel MOS device connected in series to an N channel MOS device.

18. A complementary MOS memory array in accordance with claim 17 wherein each one of said two cross-coupled complementary pairs of MOS devices has its drain regions electrically connected together.

19. A complementary MOS memory array in accordance with claim 18 wherein each one of said two cross-coupled complementary pairs of MOS devices has its gate electrodes electrically connected together.

20. A complementary MOS memory array in accordance with claim 19 wherein each one of said two cross-coupled complementary pairs of MOS devices has its gate electrodes electrically connected to the drain regions of the other one of said two cross-coupled complementary pairs of MOS devices.

* * * * *